United States Patent
Maa et al.

(10) Patent No.: US 7,247,545 B2
(45) Date of Patent: Jul. 24, 2007

(54) FABRICATION OF A LOW DEFECT GERMANIUM FILM BY DIRECT WAFER BONDING

(75) Inventors: Jer-Shen Maa, Vancouver, WA (US); Jong-Jan Lee, Camas, WA (US); Douglas J. Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 335 days.

(21) Appl. No.: 10/985,444

(22) Filed: Nov. 10, 2004

(65) Prior Publication Data

US 2006/0099773 A1 May 11, 2006

(51) Int. Cl.
*H01L 21/30* (2006.01)
*H01L 21/46* (2006.01)

(52) U.S. Cl. .................. 438/455; 438/458; 117/1; 257/E21.568

(58) Field of Classification Search ............... 438/455, 438/458; 117/1; 257/E21.568
See application file for complete search history.

(56) References Cited

U.S. PATENT DOCUMENTS

| | | | |
|---|---|---|---|
| 6,537,370 B1 | 3/2003 | Hernandez et al. | |
| 6,635,110 B1 | 10/2003 | Luan et al. | |
| 6,645,831 B1 | 11/2003 | Shaheen et al. | |
| 6,921,914 B2 * | 7/2005 | Cheng et al. | 257/19 |
| 6,927,147 B2 * | 8/2005 | Fitzgerald et al. | 438/458 |
| 6,991,956 B2 * | 1/2006 | Ghyselen et al. | 438/46 |
| 7,141,834 B2 * | 11/2006 | Atwater et al. | 257/184 |
| 2004/0173791 A1 * | 9/2004 | Cheng et al. | 257/19 |

OTHER PUBLICATIONS

Hartmann et al., *Reduced pressure-chemical vapor deposition of Ge thick layers on Si (001) for 1.3-1.55-µm photodetection*, Journal of Applied Physics, 2004, 95, 5905.
Liu et al., *High-quality single-crystal Ge on insulator by liquid-phase epitaxy on Si substrates*, Appl Phys Lett, 2004, 84, 2563.
Ritenour et al., *Epitaxial Strained Germanium p-MOSFETs with $HfO_2$ Gate Dielectric and TaN Gate Electrode*, International Electron Devices Meeting Technical Digest, 2003, p. 03-433.
Chui et al., *A Germanium NMOSFET Process Integrating Metal Gate and Improved Hi-k Dielectrics*, International Electron Devices Meeting Technical Digest, 2003, p. 03-437.
Low et al., *Germanium MOS: An Evaluation from Carrier Quantization and Tunneling Current*, 2003 Symposium on VLSI Technology Digest, p. 117-118.
Bai et al., *Ge MOS Characteristics with CVD $HfO_2$ Gate Dielectrics and TaN Gate Electrode*, 2003 Symposium on VLSI Technology Digest, p. 121.
Huang et al., *Very Low Defects and High Performance Ge-On-Insulator p-MOSFETs with $Al_2O_3$ Gate Dielectrics*, 2003 Symposium on VLSI Technology Digest, p. 119.
Takagi, *Re-examination of Subband Structure Engineering in Ultra-Short Channel MOSFETs under Ballistic Carrier Transport*, 2003 Symposium on VLSI Technology Digest, p. 115.
Nakaharal et al., *Characterization of 7-nm-thick strained Ge-on-insulator layer fabricated by Ge-condensation technique*, Appl Phys Lett, 2003, 83, 3516.
Famà et al., *High performance germanium-on-silicon detectors for optical communications*. Appl Phys Lett, 2002, 81, 856.
Colace et al., *Efficient high-speed near-infrared Ge photodectors integrated on Si substrates*, Appl Phys Lett., 2000, 76, 1231.
Luan et al., *High-quality Ge epilayers on Si with low threading-dislocation densities*, Appl Phys Lett, 1999, 75, 2909.
Hofmann et al., *Surfactant-grown low-doped germanium layers on silicon with high electron mobilities*, Thin Solid Films, 1998, 321, 125.

* cited by examiner

*Primary Examiner*—Fernando L. Toledo
(74) *Attorney, Agent, or Firm*—David C. Ripma

(57) ABSTRACT

A method of fabricating a low defect germanium thin film includes preparing a silicon wafer for germanium deposition; forming a germanium film using a two-step CVD process, annealing the germanium thin film using a multiple cycle process; implanting hydrogen ions; depositing and smoothing a layer of tetraethylorthosilicate oxide (TEOS); preparing a counter wafer; bonding the germanium thin film to a counter wafer to form a bonded structure; annealing the bonded structure at a temperature of at least 375° C. to facilitate splitting of the bonded wafer; splitting the bonded structure to expose the germanium thin film; removing any remaining silicon from the germanium thin film surface along with a portion of the germanium thin film defect zone; and incorporating the low-defect germanium thin film into the desired end-product device.

17 Claims, 2 Drawing Sheets

FABRICATION OF A LOW DEFECT GERMANIUM FILM BY DIRECT WAFER BONDING

FIELD OF THE INVENTION

This invention relates to fabrication of germanium thin films for bonding to various substrates, for use in displays, sensors and mobile device applications.

BACKGROUND OF THE INVENTION

Germanium has much higher electron and hole mobility than silicon, therefore it has been considered to replace silicon for future high speed CMOS devices: Ritenour et al., Epitaxial Strained Germanium p-MOSFETs with $HfO_2$ Gate Dielectric and TaN Gate Electrode, International Electron Devices Meeting Technical Digest, 2003, p 03–433; Chui et al., A Germanium NMOSFET Process Integrating Metal Gate and Improved Hi-k Dielectrics, International Electron Devices Meeting Technical Digest, 2003, p 03–437; Low et al., Germanium MOS: An Evaluation from Carrier Quantization and Tunneling Current, 2003 Symposium on VLSI Technology Digest, p 117–118; and Bai et al., Ge MOS Characteristics with CVD $HfO_2$ Gate Dielectrics and TaN Gate Electrode, 2003 Symposium on VLSI Technology Digest, p 121. Germanium-on-insulator is particularly desired in order to obtain MOS field-effect transistors with low-leakage current together with high performance: Huang et al., Very Low Defects and High Performance Ge-On-Insulator p-MOSFETs with $Al_2O_3$ Gate Dielectrics, 2003 Symposium on VLSI Technology Digest, p 119; Takagi, Re-examination of Subband Structure Engineering in Ultra-Short Channel MOSFETs under Ballistic Carrier Transport, 2003 Symposium on VLSI Technology Digest, p 115. Pure germanium grown directly on silicon is also the best candidate for near-infrared photodetectors due to its compatibility with silicon technology and its high absorption in the near-infrared up to 1.55 µm. It has potential application in low-cost monolithic transceivers for optical communications: Colace et al., Efficient high-speed near-infrared Ge photodectors integrated on Si substrates, Appl Phys Lett., 2000, 76, 1231; Famà et al., High performance germanium-on-silicon detectors for optical communications, Appl Phys Lett, 2002, 81, 586; Hartmann et al., Reduced pressure-chemical vapor deposition of Ge thick layers on Si (001) for 1.3–1.55-µm photodetection, Journal of Applied Physics, 2004, 95, 5905; and U.S. Pat. No. 6,645,831 B1, to Shaheen et al., granted Nov. 11, 2003, for Thermally Stable Crystalline Defect-Free Germanium Bonded to Silicon and Silicon Dioxide. Due to the process compatibility, it is possible to integrate high speed device with germanium-based photodectors for many potential applications.

Shaheen et al. has disclosed a method to form germanium film by bonding germanium wafer on silicon or silicon dioxide. A thinning step is needed to obtain the desired thickness, U.S. Pat. No. 6,645,831 B1, supra. Huang et al., also reported performance of Ge-on-oxide p-MOSFETs, wherein the Ge-on-oxide film was obtained by direct wafer bonding of $SiO_2$/Ge and $SiO_2$/Si wafers and subsequent etch-back of backside Ge. Huang et al., supra. All of these require the use of high quality germanium wafers. However, germanium wafers have poor mechanical and thermal properties, and high quality germanium wafers are still of limited supply.

Nakaharai et al. reported a Ge-condensation technique to fabricate Ge-on-insulator, Nakaharal et al., Characterization of 7-nm-thick strained Ge-on-insulator layer fabricated by Ge-condensation technique, Appl Phys Lett, 2003, 83, 3516, however, only a 7 nm thick germanium layer was formed, and the film was under compressive strain. It is difficult to apply this technique for photodetector application, which requires a thicker film to increase the light absorption.

Liu et al. reported a liquid-phase epitaxy technique to fabricate germanium on insulator, Liu et al., High-quality single-crystal Ge on insulator by liquid-phase epitaxy on Si substrates, Appl Phys Lett, 2004, 84, 2563. This technique requires careful temperature control in order to initiate the recrystallization at the predetermined seeding region.

To avoid the use of bulk germanium wafers, a possible approach is to grow an epitaxial germanium layer on a silicon wafer, followed by transfer the germanium layer to an insulator, glass, or silicon substrate, by a direct wafer bonding technique.

Because of a large lattice mismatch between germanium and silicon, i.e., 4.2%, fabrication of germanium films on silicon having proper flatness and low defect density for high speed devices is difficult. Ritenour et al., supra, reported their work with epitaxial strained germanium p-MOSFET by growing thin germanium layer on thick relaxed SiGe buffer layer. Hofmann et al. were able to grow a 1 µm thick relaxed germanium layer by surfactant-mediated epitaxy on (111) silicon, Hofmann et al., Surfactant-grown low-doped germanium layers on silicon with high electron mobilities, Thin Solid Films, 1998, 321, 125. Luan et al., High-quality Ge epilayers on Si with low threading-dislocation densities, Appl Phys Lett, 1999, 75, 2909, have reported a technique to deposit germanium epilayer on single crystal silicon by first depositing at 350° C. and then at 600° C. This two-step process is also disclosed in U.S. Pat. No. 6,537,370 B1, to Hernandez et al., granted Mar. 25, 2003, for Process for obtaining a layer of single-crystal germanium on a substrate of single-crystal silicon, and products obtained. U.S. Pat. No. 6,635,110 B1, to Luan et al., granted Oct. 21, 2003, for Cycle thermal anneal for dislocation reduction, discloses a technique of cycle annealing to reduce the defect density of the germanium film. Using similar techniques, several groups have reported the use of the preceding techniques in fabrication of near-infrared germanium photodetectors: Colace et al., Efficient high-speed near-infrared Ge photodectors integrated on Si substrates, Appl Phys Lett., 2000, 76, 1231; Famà et al., High performance germanium-on-silicon detectors for optical communications, Appl Phys Lett, 2002, 81, 586; and Hartmann et al., Reduced pressure-chemical vapor deposition of Ge thick layers on Si (001) for 1.3–1.55-µm photodetection, Journal of Applied Physics, 2004, 95, 5905.

Cycle annealing reduces defects, which are concentrated near the germanium/silicon interface. However, it is difficult to completely remove this defect zone, because it is at the bottom of the germanium film.

SUMMARY OF THE INVENTION

A method of fabricating a low defect germanium thin film includes preparing a silicon wafer for germanium deposition; forming a germanium film using a two-step CVD process, wherein a first CVD step is performed at a temperature of between about 250° C. to 300° C., to form a continuous germanium film, and wherein a second CVD step is performed at a temperature of about 700° C., to form a relaxed germanium thin film; depositing a layer of germanium on the relaxed germanium thin film; annealing the germanium thin film using a multiple cycle process, wherein a first cycle is performed at a relatively higher temperature of between about 840° C. to 900° C., and a second cycle is performed at a relatively lower temperature of between about 750° C. to 840° C., and wherein the first and second cycles are altered for between about 10 to 40 cycles to concentrate any defects in the germanium thin film in a region near the germanium/silicon interface; implanting hydrogen ions; depositing a layer of tetraethylorthosilicate oxide (TEOS); smoothing the TEOS layer by CMP; cleaning the TEOS layer; preparing a counter wafer; bonding the germanium thin film to the counter wafer to form a bonded structure; annealing the bonded structure at a temperature of at least 375° C. to facilitate splitting of the bonded wafer; splitting the bonded structure to expose the germanium thin film; removing any remaining silicon from the germanium thin film surface along with a portion of the germanium thin film defect zone; and incorporating the low-defect germanium thin film into the desired end-product device.

It is an object of the invention to provide a method of fabricating a low defect germanium film on an insulator, such as glass or on a silicon substrate, by direct wafer bonding of a germanium film formed by CVD.

Another object of the method of the invention is to provide a technique for multiple cycle annealing of a germanium thin film to reduce defect and to localize defect concentration in a location which may be further manipulated.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

A major feature of the method of the invention is a two-step germanium deposition and cycle anneal to form a low defect germanium film. The results demonstrate that the defects are concentrated on the region near the germanium/silicon interface. After wafer bonding and splitting, this damaged region is on the top of the germanium film, and may be removed by CMP or etching.

The advantages of this invention are threefold: (1) it allows germanium transfer without the use a bulk germanium wafer, making the process cheaper and providing for easier manipulation of the germanium component of an IC device; (2) the remaining defects, after cycle anneal, may be removed after film transfer, while in all previous work, the defect zone was located at the bottom of the germanium film, making it impossible to remove the defects without damaging the germanium film; and, (3) a low defect germanium film may be formed on insulator, glass, or on a silicon wafer, which are useful in CMOS and NIR photodetector applications.

Figure 1A:
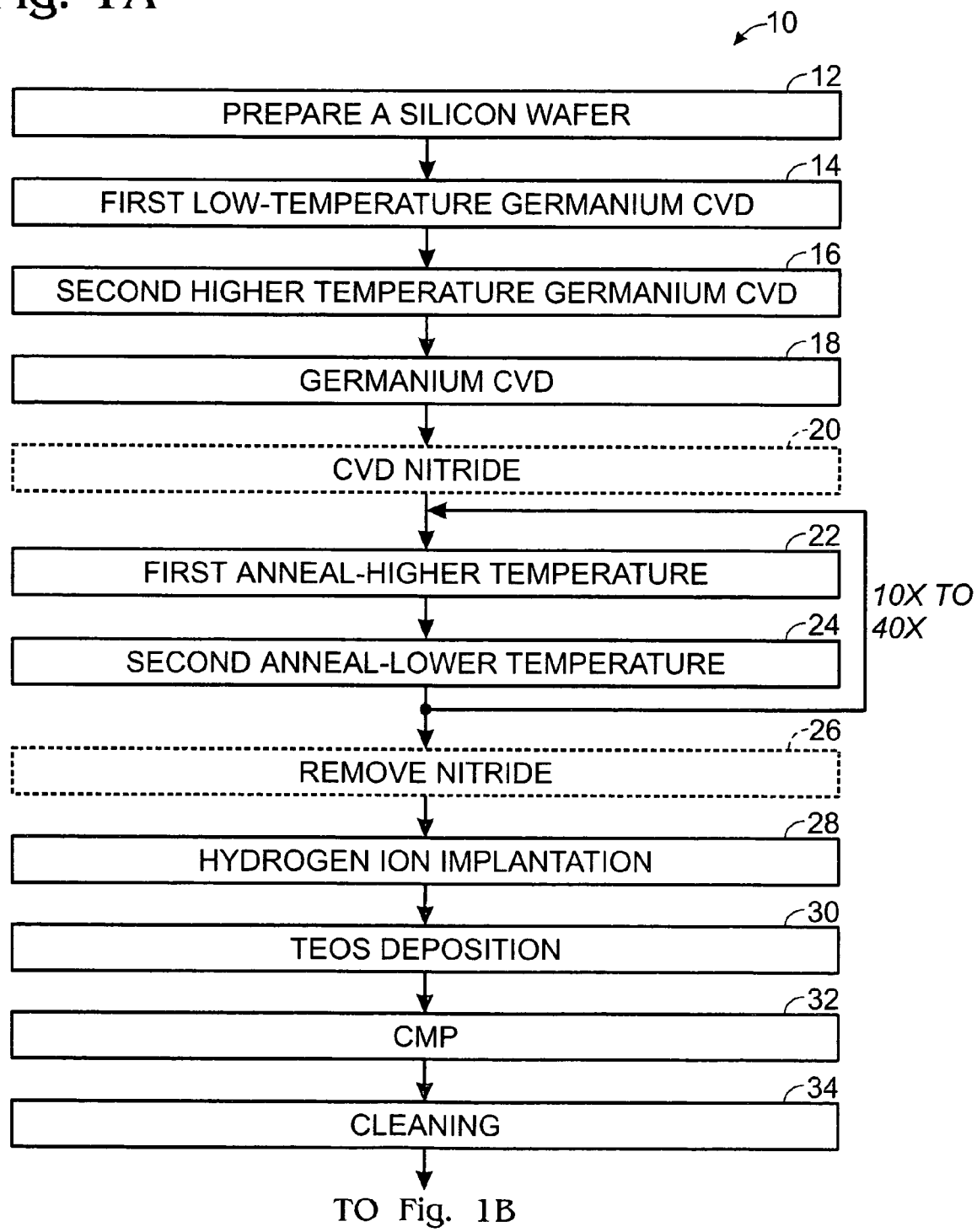
FIG. 1 is a block diagram of the method of the invention.
Figure 1B:
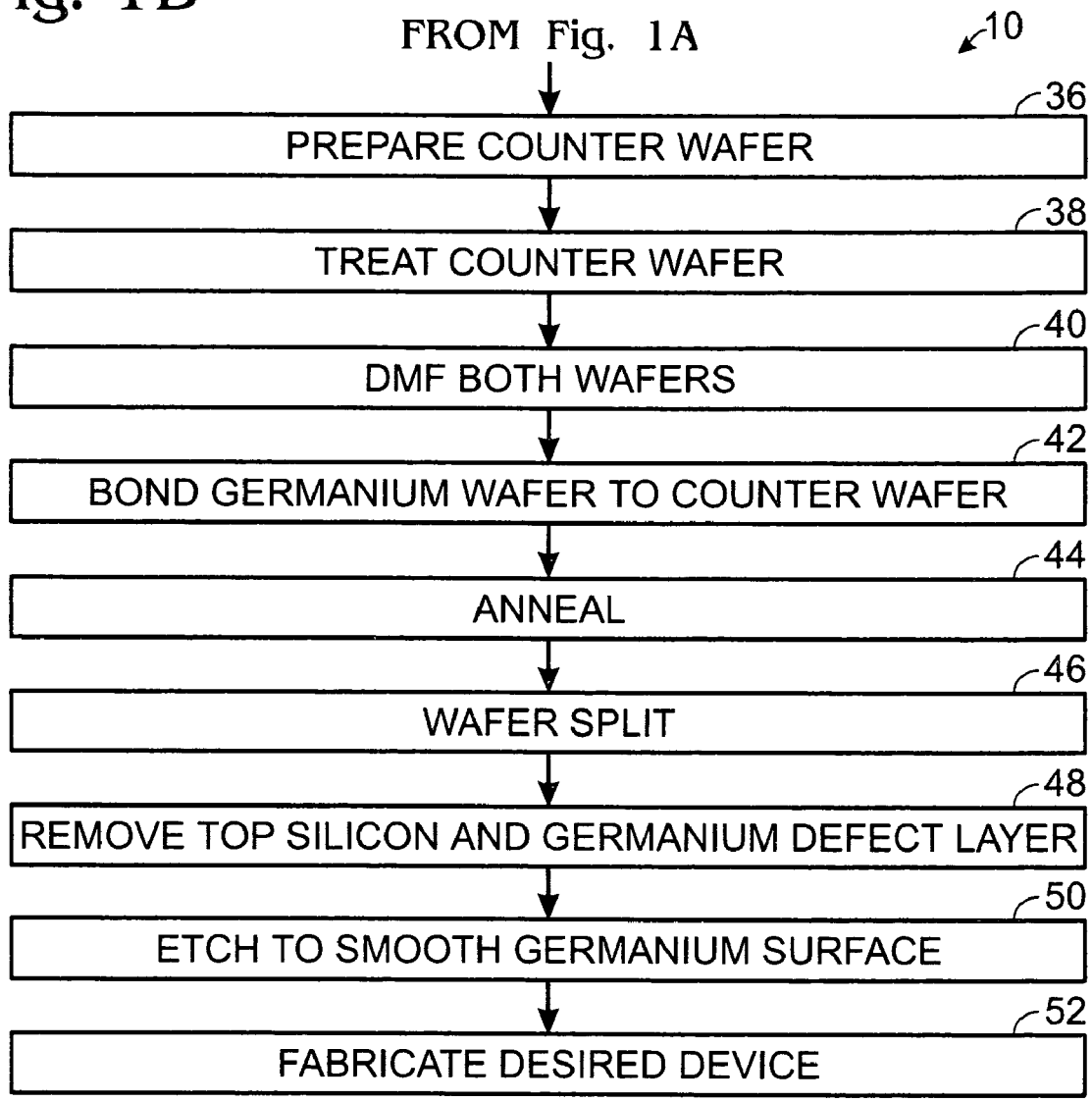

The steps of the method of the invention are depicted in FIG. 1, generally at 10. Initially, a silicon wafer is prepared 12 for germanium deposition, by dipping the silicon wafer in DHF, followed by a rapid rinse/dry cycle.

Formation of the germanium film is a two-step CVD process, first at a lower temperature, 14, of between about around 250° C. to 300° C., to form a continuous germanium film, and then at a temperature of about 700° C., 16, followed by another germanium deposition step, 18, on relaxed germanium film. A layer of buffer silicon may also be deposited before the first germanium deposition step.

At this point, an optional step of depositing by CVD a thin layer of nitride 20, e.g., having a thickness of between about 10 nm to 100 nm, on the wafer surface.

The germanium film is annealed through a multiple cycle process, initially at a relatively higher temperature of between about 840° C. to 900° C., 22, and then at a relatively lower temperature of between about 750° C. to 840° C., 24. This cycle anneal results in any defects being concentrated in a region near the germanium/silicon interface. The number of cycle is between 10 to 40, each having a duration of between about one minute to five minutes. A CMP step may be required to remove the roughness generated by the cycle annealing.

If optional step 20 was performed before the multiple cycle anneal process, the nitride is removed, 26, by treating the wafer with phosphoric acid.

Hydrogen implantation 28 is performed in preparation for film exfoliation, which is followed by deposition of a tetraethylorthosilicate oxide (oxane) (TEOS) layer, 30. Alternately, the TEOS may be deposited before the hydrogen implantation. The hydrogen implant step is performed using $H_2^+$ ions at a dose of about 4E 16 $cm^{-2}$ at an energy of between about 140 keV to 250 keV. The TEOS layer is smoothed by CMP, 32, followed by SC-1, SC-2 cleaning, 34.

The substrate to which the germanium thin film will be bonded is prepared, 36. The counter wafer may be an oxidized silicon wafer, a glass wafer, or a silicon wafer. If the germanium thin film is to be bonded to glass, the glass surface may be coated with a dielectric film, such as TEOS or PECVD oxide. If the germanium thin film is to be bonded to silicon, the germanium thin film surface may require an additional CMP step to remove any minor surface roughness. The counter wafer is treated in a dilute SC-1 solution 38, to form a hydrophilic surface on the wafer. Both wafers are then subjected to an DHF dip 40, to remove any particulate matter which may be on the wafer surfaces.

The germanium thin film is next bonded to the counter wafer, 42, to form a bonded structure. The bonding is performed in a clean room environment at ambient temperature. The bonded structure is annealed 44, at a temperature of 375° C. or higher, to facilitate splitting 46 of the bonded wafer. After wafer splitting, the germanium film is exposed, with the defect zone now at the surface thereof. It is likely that some silicon will remain on the germanium film, because the hydrogen implantation range is deeper than the thickness of germanium film. Any remaining silicon is removed, along with a portion of the germanium thin film defect zone, 48, by CMP, dry etch or wet etch, or by a combination of etching steps, 48. The CMP step can ensure the formation of a smooth germanium surface, however, an additional etching step 50 may be required to smooth the surface. The remaining germanium film has much lower defect density than germanium films deposited on silicon without the film transfer and etching steps of the method of the invention. The low-defect germanium thin film is now available for incorporation into the desired end-product device, 52.

Thus, a method for fabrication of a low defect germanium film by direct wafer bonding has been disclosed. It will be appreciated that further variations and modifications thereof may be made within the scope of the invention as defined in the appended claims.

We claim:

1. A method of fabricating a low defect germanium thin film, comprising:
   preparing a silicon wafer for germanium deposition;
   forming a germanium film using a two-step CVD process, wherein a first CVD step is performed at a temperature of between about 250° C. to 300° C., to form a continuous germanium film, and wherein a second CVD step is performed at a temperature of about 700° C., to form a relaxed germanium thin film;
   depositing a layer of germanium on the relaxed germanium thin film;
   annealing the germanium thin film using a multiple cycle process, wherein a first cycle is performed at a relatively higher temperature of between about 840° C. to 900° C., and a second cycle is performed at a relatively lower temperature of between about 750° C. to 840° C., and wherein the first and second cycles are alternately performed for between about 10 to 40 cycles to concentrate any defects in the germanium thin film in a region near the germanium/silicon interface;
   implanting hydrogen ions;
   depositing a layer of tetraethylorthosilicate oxide (TEOS);
   smoothing the TEOS layer by CMP;
   cleaning the TEOS layer;
   preparing a counter wafer;
   bonding the germanium thin film to the counter wafer to form a bonded structure;
   annealing the bonded structure at a temperature of at least 375° C. to facilitate splitting of the bonded wafer;
   splitting the bonded structure to expose the germanium thin film;
   removing any remaining silicon from the germanium thin film surface along with a portion of the germanium thin film defect zone; and
   incorporating the low-defect germanium thin film into the desired end-product device.

2. The method of claim 1 wherein said preparing a silicon wafer includes dipping the silicon wafer in DHF, followed by a rapid rinse/dry cycle.

3. The method of claim 1 which includes depositing a layer of buffer silicon before the first CVD step.

4. The method of claim 1 wherein each cycle of the multiple cycle process has a duration of between about one minute to five minutes.

5. The method of claim 1 wherein said preparing a counter wafer includes preparing a counter wafer taken from the group of counter wafers consisting of an oxidized silicon wafer, a glass wafer, and a silicon wafer.

6. The method of claim 5 wherein, if the germanium thin film is to be bonded to glass, coating the glass surface with a dielectric film; and if the germanium thin film is to be bonded to silicon, smoothing the germanium thin film surface by CMP.

7. The method of claim 5 which further includes cleaning the counter wafer in a dilute SC-1 solution to form a hydrophilic surface on the counter wafer.

8. The method of claim 1 wherein said removing any remaining silicon from the germanium thin film surface along with a portion of the germanium thin film defect zone includes removing using a removal technique taken from the group of removal techniques consisting of CMP, dry etching, wet etching and a combination of etching steps.

9. The method of claim 1 which includes CVD of a nitride layer before said annealing the germanium thin film using a multiple cycle process; and removal of the nitride layer after said annealing the germanium thin film using a multiple cycle process.

10. A method of fabricating a low defect germanium thin film, comprising:
    preparing a silicon wafer for germanium deposition;
    forming a germanium film using a two-step CVD process, wherein a first CVD step is performed at a temperature of between about 250° C. to 300° C., to form a continuous germanium film, and wherein a second CVD step is performed at a temperature of about 700° C., to form a relaxed germanium thin film;
    depositing a layer of germanium on the relaxed germanium thin film.
    annealing the germanium thin film using a multiple cycle process, wherein a first cycle is performed at a relatively higher temperature of between about 840° C. to 900° C., and a second cycle is performed at a relatively lower temperature of between about 750° C. to 840° C., and wherein the first and second cycles are altered for between about 10 to 40 cycles to concentrate any defects in the germanium thin film in a region near the germanium/silicon interface, wherein each cycle of the multiple cycle process has a duration of between about one minute to five minutes;
    implanting hydrogen ions;
    depositing a layer of tetraethylorthosilicate oxide (TEOS);
    smoothing the TEOS layer by CMP;
    cleaning the TEOS layer;
    preparing a counter wafer;
    bonding the germanium thin film to the counter wafer to form a bonded structure;
    annealing the bonded structure at a temperature of at least 375° C. to facilitate splitting of the bonded wafer;
    splitting the bonded structure to expose the germanium thin film;
    removing any remaining silicon from the germanium thin film surface along with a portion of the germanium thin film defect zone; and
    incorporating the low-defect germanium thin film into the desired end-product device.

11. The method of claim 10 wherein said preparing a silicon wafer includes dipping the silicon wafer in DHF, followed by a rapid rinse/dry cycle.

12. The method of claim 10 which includes depositing a layer of buffer silicon before the first CVD step.

13. The method of claim 10 wherein said preparing a counter wafer includes preparing a counter wafer taken from the group of counter wafers consisting of an oxidized silicon wafer, a glass wafer, and a silicon wafer.

14. The method of claim 13 wherein, if the germanium thin film is to be bonded to glass, coating the glass surface with a dielectric film; and if the germanium thin film is to be bonded to silicon, smoothing the germanium thin film surface by CMP.

15. The method of claim 13 which further includes cleaning the counter wafer in a dilute SC-1 solution to form a hydrophilic surface on the counter wafer.

16. The method of claim 10 wherein said removing any remaining silicon from the germanium thin film surface along with a portion of the germanium thin film defect zone includes removing using a removal technique taken from the group of removal techniques consisting of CMP, dry etching, wet etching and a combination of etching steps.

17. The method of claim 10 which includes CVD of a nitride layer before said annealing the germanium thin film using a multiple cycle process; and removal of the nitride layer after said annealing the germanium thin film using a multiple cycle process.

* * * * *